HIGH FREQUENCY TUNER

Filed Feb. 17, 1958 3 Sheets-Sheet 1

INVENTORS
ALARICO A. VALDETTARO,
CHALMER H. LEWIS, JR. AND
JOHN C. ROBINSON
BY
Mason, Kolehmainen, Rathburn and Wyss.
ATTORNEYS INVENTORS
ALARICO A. VALDETTARO,
CHALMER H. LEWIS, JR. AND
JOHN C. ROBINSON
BY
Mason, Kolehmainen, Rathburn and Wyss.
ATTORNEYS INVENTORS
ALARICO A. VALDETTARO,
CHALMER H. LEWIS, JR. AND
JOHN C. ROBINSON
BY
Mason, Kolehmainen, Rathburn and Wyss.
ATTORNEYS

3,018,372
HIGH FREQUENCY TUNER

Alarico A. Valdettaro, Chalmer H. Lewis, Jr., and John C. Robinson, Bloomington, Ind., assignors to Sarkes Tarzian, Inc., Bloomington, Ind., a corporation of Indiana Filed Feb. 17, 1958, Ser. No. 715,744
4 Claims. (Cl. 250—20)

The present invention relates to high frequency tuners of the type employed in television receivers, and more particularly to a new and improved tuner circuit which reduces the manufacturing cost of television receivers by reducing the number of separate tubes which must be employed therein so as to satisfactorily reproduce a received television signal.

Conventionally, television receivers are of the superheterodyne type and the tuner sections of such receivers ordinarily comprise an RF amplifier stage, an oscillator stage, and a mixer stage. In the mixer stage the high frequency signal which is locally developed in the oscillator is mixed with a selected one of the signals received by the antenna and amplified by the RF amplifier section, to produce a composite wave including an IF signal. A filter arrangement is provided in the output circuit of the mixer to select the desired IF signal and to couple it to the IF channel of the receiver. Each of these separate sections of the tuner necessarily employs one or more adjustably tuned resonant circuits which are tunable by the main tuning shaft throughout the desired range to amplify and convert each of the received signals to the IF frequency, and it is most important that interaction between these tuned circuits be entirely eliminated or at least sufficiently reduced so as to be negligible. Otherwise, alignment of the tuner would be particularly difficult and time-consuming since each time that one of the tuned circuits was adjusted the tuned circuits in each of the other sections would be affected so as to require readjustment thereof. Similarly, whenever a tube is changed in the tuner, realignment of all sections would be necessary. Obviously, this is undesirable, and in order to effectively isolate each of these tuned circuits from one another, it has been the practice in prior art tuners to employ one tube for providing RF amplification and a separate and independent dual type tube in which the mixer and oscillator tube sections are provided. Consequently, in spite of the fact that dual purpose tubes have been employed in high frequency design for many years, the use of such tubes in television tuners has been limited by this undesirable interaction between the different tuned circuits which occurs when dual type tubes are employed in conventional superheterodyne circuits at these frequencies.

Accordingly a principal object of the present invention is to provide a new and improved television tuner.

Another object of the present invention is to provide a new and improved television tuner which may be manufactured at a cost which is appreciably less than the cost of making prior art type tuners having comparable operating characteristics.

A further object of the present invention is to provide a new and improved tuner circuit which enables the use of dual purpose tubes without causing undue interaction between the tuned circuits of the various sections of the tuner.

Still another object of the present invention is to provide a new and improved television tuner which employs a single tube as the mixer, oscillator, and first IF amplifier stage of the television receiver, thereby reducing the number of separate tubes required in the receiver.

Very briefly, the above and further objects are realized in accordance with the present invention by providing a television tuner including an autodyne mixer-oscillator stage and an IF amplifier stage, the IF amplifier stage and the mixer-oscillator comprising a single vacuum tube, another tube being provided for the RF amplifier.

In accordance with a particular aspect of this invention, interaction between the oscillator tuned circuit and the tuned input circuit to the mixer is reduced by means of a balanced bridge arrangement which interconnects the mixer and oscillator tuned circuits. In addition, another balanced bridge circuit is provided to reduce the interaction between the IF tuned circuits and the mixer and oscillator tuned circuits to a negligible value.

In accordance with a further aspect of the invention, interaction between the tuned circuits of the IF amplifier and the tuned circuits of the oscillator-mixer are further reduced by employing a mixer-oscillator tube which has a common cathode, a pair of anodes and directly interconnected control electrodes respectively disposed between the cathode and each of the anodes. With this circuit, the IF signal is extracted from one of the anodes, the other anode being connected in the oscillator circuit. Since the IF amplifier is thus driven from an independent driving circuit, changes in the IF amplifier cricuit have very little affect on the mixer-grid and osscillator circuit.

Therefore, in all three illustrated embodiments of the present invention a tube having a single envelope provides IF amplification as well as the mixer and oscillator functions in a tuner in which interaction between the sections which operate at different frequencies is avoided.

The invention, both as to its organization and method of operation, together with further objects and advantages thereof, will best be understood by reference to the following detailed description taken in connection with the accompanying drawings, in which.

Figures 1, 2:
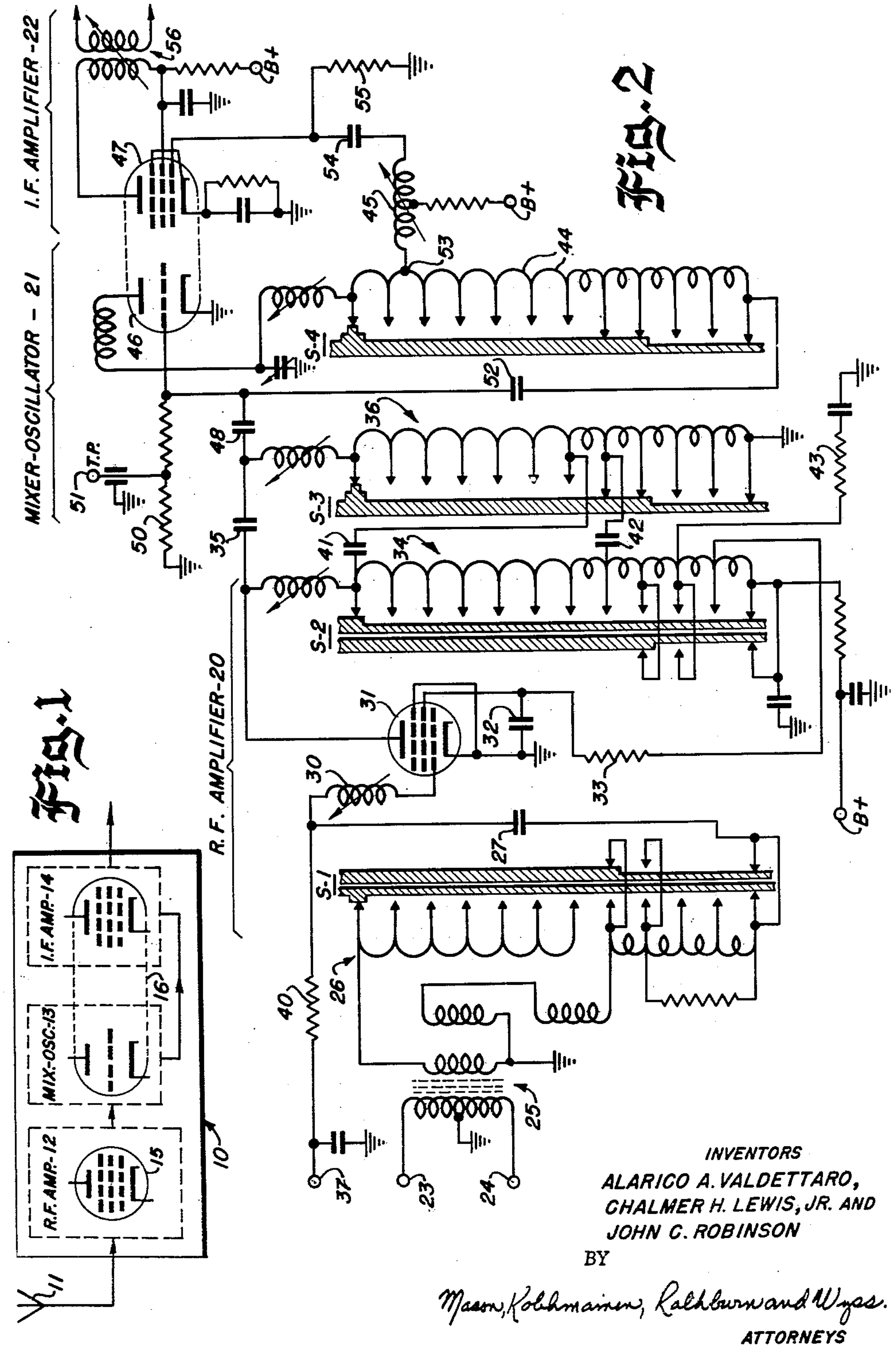
FIG. 1 is a block diagram of a portion of a television receiver showing the number of tubes employed in a tuner of the present invention and the number of functions provided by these tubes.
FIG. 2 is a schematic circuit diagram of a television tuner embodying certain aspects of the present invention.

Before considering in detail the various circuits disclosed in the illustrated embodiments of the invention, reference is made to FIG. 1, wherein is shown in diagrammatic form the tuner section 10 of a television receiver (not shown) for reproducing signals received by an antenna 11. The signals received by the antenna 11 are supplied to the RF amplifier section designated by the numeral 12 wherein a selected one of the many signals receivable by the antenna 11 is amplified. The amplified RF signal is then supplied to a mixer-oscillator section 13 in which is developed a high frequency oscillator signal for superheterodyning with the amplified RF signal. Accordingly, there is produced an IF signal which is of lesser frequency than the received television signal and which has the same intelligence characteristics thereof. This IF signal is supplied through a suitable selection filter to the IF amplifier portion, designated 14, of the tuner 10 where it is amplified prior to application to the IF channel of the receiver. Ordinarily, no IF amplification is provided in the tuner of a television receiver, and, therefore, the tuner 10 of the present invention reduces the number of IF amplification stages which are required in the main chassis of the receiver to elevate the value of the IF signal to the necessary level for application to the second detector.

As best shown in FIG. 1, the RF amplifier 12 employs a single tube 15 for effecting the necessary amplification and selection of the RF signal, and the RF amplifier 12 may be of any suitable type, such, for example, as a pentode amplifier, a tetrode amplifier, or a cascode amplifier, each of which requires the use of only one tube.

In accordance with this invention, the mixer-oscillator section of the tuner 10 and the IF amplifier of the tuner 10 comprise a single dual type tube 16 which may be, for example, of the triode-tetrode or triode-pentode type, the mixer-oscillator section employing one-half of this dual type tube 16 in an autodyne circuit to convert the amplified RF signal to an IF signal and the IF amplifier employing the other half of this tube to provide the necessary gain therein. Since interaction between the tuned circuits of the tuner principally occurs between the RF amplifier tuned circuits and either the mixer tuned circuit, the oscillator tuned circuit, or both, by employing a separate RF amplifier tube 15 which is exclusive of the mixer-oscillator tube 16, feedback which would occur within the tube if a single tube were used to provide RF amplification and mixing or oscillating is avoided, and the major cause of tuned circuit interaction is eliminated. Moreover, the advantages of the autodyne oscillator-mixer circuit to reduce the number of tubes required to effect a number of different functions is utilized by employing the dual type tube 16, one section being employed in the autodyne circuit and the other section being used to provide the first stage of IF amplification. Although some interaction between the IF amplifier tuned circuit and the mixer-oscillator tuned circuit occurs, this disadvantage is offset in most commercial applications by the substantial reduction in the manufacturing cost of the tuner 10. Moreover, this interaction between the IF amplifier section 14 and the mixer-oscillator section 13 may be entirely eliminated or at least reduced to a negligible value by use of the circuit designs of the present invention which are described hereinafter in connection with FIGS. 3 and 4. The present invention thus provides a tuner whose use in a television receiver reduces the overall cost thereof by reducing the number of tubes required without increasing the cost of the tuner itself by a comparable amount and without detracting from the operational characteristics thereof.

Referring now to FIG. 2, the high frequency tuner circuit which is there shown in schematic form comprises a tuned RF amplifier section 20, an autodyne mixer-oscillator section 21, and an IF amplifier section 22. The television signals which are received by an antenna system connected to the antenna terminals 23 and 24 are coupled through an antenna input transformer 25, one of these signals is selectively coupled by an adjustably tuned resonant circuit 26, a coupling condenser 27, and an adjustable coil 30 between the control electrode and cathode of an RF amplifier tube 31. Conventionally, the resonant circuit 26 comprises a plurality of incremental inductances which are selectively connected between the transformer 25 and the capacitor 27 by means of a selector switch S–1 controlled by the main tuning or channel selector shaft. In the illustrated embodiment of the invention the RF amplifier tube 31 is a pentode having the suppressor electrode and the cathode connected to ground and the screen electrode connected across a bypass condenser 32 and through a resistor 33 to a tap point on a resonant circuit 34 comprising a plurality of incremental inductances which resonate with the leakage, interelectrode and wiring capacitances of the associated circuit. A switch S–2, which is ganged to the switch S–1, is used to tune the plate circuit of the amplifier 31 to each of the receivable television signals by selectively connecting the incremental inductances of the resonant circuit 34 into the plate circuit of the RF amplifier 20.

In order to maintain the amplitude of the RF signal supplied to the mixer-oscillator 21 substantially constant irrespective of variations in the strength of the received signal, an AGC voltage, which is developed in the second detector circuit of the associated television receiver, is impressed upon an AGC terminal 37 and is supplied through a resistor 40 and the adjustable coil 30 to the control grid of the amplifier 31 thereby to adjust the bias on the tube 31 in accordance with the strength of the signal received by the associated antenna system.

The amplified RF signal which appears between the anode and cathode of the RF amplifier tube 31 is coupled through a coupling capacitor 35 to a resonant input circuit 36 of the mixer-oscillator section 21. The circuit 36 comprises a plurality of incremental inductances which are tuned by the leakage, wiring and interelectrode capacitances of the associated circuit. The particular ones of the incremental inductances which are connected in the input circuits of the mixer-oscillator 21 is determined by the position of a selector switch S–3 which is mechanically ganged to the switches S–1 and S–2 for simultaneous rotation therewith.

As shown, an additional pair of coupling condensers 41 and 42 are connected between the tuned circuit 34 and the tuned circuit 36, the coupling effect of these condensers increasing as the switches S–2 and S–3 advance toward the low frequency positions, and a resistor 43 provides a load to offset the tight coupling provided by the condensers 41 and 42 at the lower frequencies.

The mixer-oscillator circuit 21 is a substantially conventional autodyne mixer-oscillator employing a triode 46 having tuned input and output circuits. The input or mixer circuit is adapted to be adjustably tuned to the selected RF circuit and the oscillator circuit is adapted to be tuned to provide the desired local oscillator frequency. The anode circuit comprises a resonant circuit 44 which is connected to the anode of the tube 46 and which comprises a plurality of incremental inductances which are adapted to be selectively connected in the circuit 44 by a selector switch S–4, which is ganged to the switches S–1, S–2, and S–3. With the various tuned circuits of the tuner properly adjusted, an IF signal is developed across the tuned circuit 44, which signal is selectively coupled by an m-derived pi filter 45 and a capacitor 54 to the IF amplifier 22. As shown, the triode 46 is enclosed within the same envelope as is a pentode 47 which provides the IF amplification. It should be noted, however, that in order to connect the cathode of the IF amplifier section to ground through a capacitor while connecting the cathode of the triode directly to ground, it is important that this tube employ separate cathodes for the two sections.

Considering the mixer-oscillator circuit 21 in greater detail, the RF signal which is developed across the tuned circuit 36 is coupled through the capacitor 48 between the control grid and cathode of the triode 46, the usual grid leak resistor 50 being connected between the control grid of the triode 46 and ground. Preferably, the grid leak resistor 50 comprises a pair of serially connected resistors the junction of which is connected to a suitable terminal through a shielded cable to provide a test point 51 which may be used to observe the waveform of a signal supplied to the mixer-oscillator 21 during alignment of the tuner. The necessary feedback connection to maintain oscillation in the mixer-oscillator 21 is provided from the anode of the triode 46 through the tuned circuit 44 and through a blocking capacitor 52 to the control grid of the triode 46. A portion of the anode signal from the triode 46, which because of conventional autodyne operation, includes the IF signal, is taken from a tap point 53 on the tuned circuit 44 and coupled through the m-derived pi type coupling filter 45 and the blocking capacitor 54 to the control grid of the IF amplifier tube section 47, a grid leak resistor 55 being connected between the control grid of the tube 47 and ground. The primary winding of a tuned coupling transformer 56 is connected in the anode circuit of the pentode 47 and couples the IF amplified signal from the IF amplifier 22 to the second IF stage of the receiver. The tap point 53 is selected so as to be at the virtual RF ground point of the oscillator tuned circuit 44 when the oscillator is tuned to one of the high frequency channels such, for example, as channel 12 or 13. Since interaction is greatest at the higher frequencies, this reduces the interaction between the oscillator and IF circuits. The circuit of FIG. 2 thus utilizes but two tubes to provide RF amplification and selection, superheterodyning and IF amplification. Moreover, separate RF and mixer-oscillator tubes are employed so as to effectively eliminate interaction between the RF tuned circuits and the mixer and oscillator tuned circuits.

Figure 3:
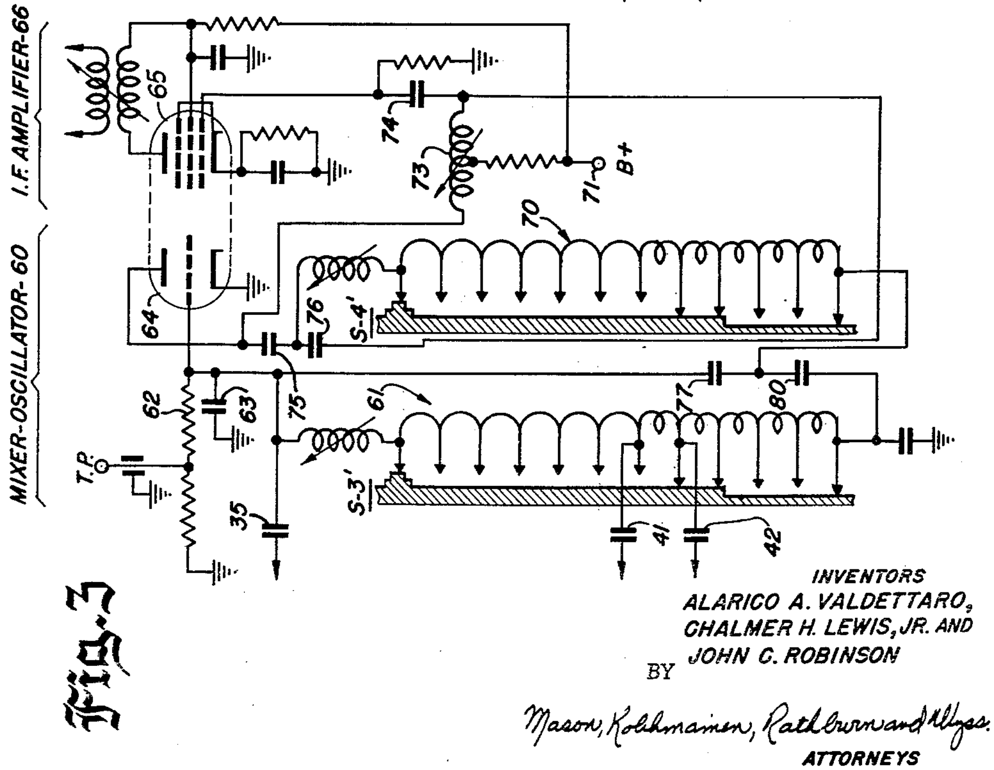
FIG. 3 is a schematic circuit diagram of a television tuner embodying certain other aspects of the present invention.

Refer now to FIG. 3, wherein is shown a portion of a tuner which employs a balanced bridge coupling arrangement to further reduce interaction between the IF amplifier section and the mixer-oscillator section of an autodyne mixer-oscillator tuner. Since the RF amplifier portion of a tuner including the circuit of FIG. 3 is identical with the RF portion of the circuit of FIG. 2, it will be understood that the RF amplifier 20 in FIG. 2 supplies the signals which are coupled through the capacitors 35, 41 and 42 to the mixer-oscillator 60 of FIG. 3. Therefore, the RF signal which is selected and amplified in the RF amplifier 20 is coupled through the capacitors 35, 41 and 42 across a tuned input circuit 61 which includes a plurality of incremental inductive elements resonated by the stray wiring, leakage and interelectrode capacitances of the associated circuit. The ones of these incremental inductive elements which are selectively connected in the resonant circuit 61, and, therefore, the particular frequency to which the resonant circuit 61 is tuned, is determined by a switch S–3′ which is ganged to the switches S–1 and S–2 of the RF amplifier 20. The RF signal which is thus developed across the tuned circuit 61 is connected across a suitable grid leak resistance network 62 and a capacitor 63 between the control electrode and cathode of a triode 64 which is contained within the same envelope as is a pentode 65 which provides the gain for an IF amplifier circuit 66. The triode 64 is part of an autodyne mixer-oscillator circuit which includes an adjustably tuned output circuit 70 comprising a plurality of incremental inductances which are selectively connected in the tuned circuit 70 to determine the resonant frequency thereof. A switch S–4′, which is ganged to the switch S–3′ for simultaneous operation therewith, controls the resonant frequency of the circuit 70. The IF output signal which is developed across the plate to cathode circuit of the triode 64 is selectively coupled through a tuned m-derived pi type filter 73 and a capacitor 74 to the control grid of the pentode amplifier 65, the B+ operating voltage for the triode 64 and for the pentode 65 being supplied from a suitable B+ terminal 71.

As is well known in the art, there is some point along the inductor 73 which, for the IF frequency, is at virtual ground potential. Accordingly, in order to eliminate the effects of the adjustment of the filter 73, as well as that of the other tuned circuits of the IF amplifier 66, on the effective resonant frequency of the tuned circuit 70, a pair of serially connected capacitors 75 and 76 are connected across the inductor 73 which are selected to have such relative values that the junction between the two is also at virtual ground potential for the IF signal. Therefore, in accordance with the present invention, the junction of the capacitors 75 and 76 is connected to one end of the resonant circuit 70 thereby to prevent interaction between the IF and oscillator-tuned circuits. The other end of the resonant circuit 70 is connected to the junction point of a pair of capacitors 77 and 80 which are connected across the resonant circuit 61 and which have relative values such that the junction between the two is at the signal RF ground potential as determined by the resonant circuit 61. The junction of the capacitors 77 and 80 is independent of frequency thereby to prevent interaction between the mixer and oscillator resonant circuits throughout the tuning range of the tuner. The capacitors 75, 76, 77 and 80 thus comprise a balanced bridge network through which the feedback signal from the plate of the triode 64 is fed back in proper phase to the input circuit of the triode 64. Inasmuch as the potential at junction 75—76 and 77—80 do not appreciably vary with adjustment of the tuned circuits 61, 70, or the tuned circuits of the IF amplifier 66, all of the tuned circuits of the tuner are mutually independent and adjustment of one does not appreciably affect the adjustment of the others. It will thus be understood that with the circuit of FIG. 3 as with that of FIG. 2 the number of tubes in the tuner is reduced without producing interaction between the various tuner sections so that if, for example, the individual tubes in the tuner are changed, realignment of the entire tuner is not necessary.

Figure 4:
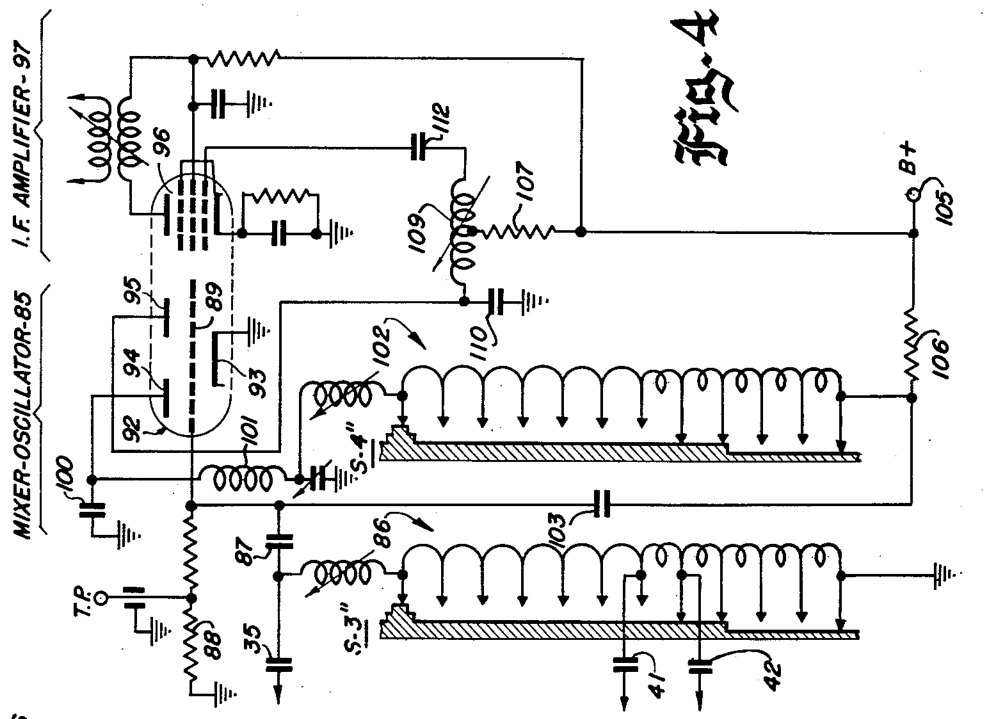
FIG. 4 is a schematic circuit diagram of a television tuner employing certain additional aspects of the present invention.

Refer now to FIG. 4 wherein is shown a portion of a high frequency tuner embodying an oscillator-mixer circuit for the purpose of increasing the number of functions performed by the tuner without increasing the number of tubes conventionally employed in such tuners. This circuit employs a particular type of dual tube which acts in conjunction with the associated circuit to reduce the interaction between the IF amplifier and the mixer-oscillator sections of the tuner. As described in connection with FIG. 3, the RF amplifier 20 of FIG. 2 may be used with the circuit of FIG. 4 to supply the necessary amplified RF signal through the coupling capacitors 35, 41 and 42 to the mixer-oscillator section 85.

In operation, the RF signal from the RF amplifier is supplied across a tuned input or mixer circuit 86 which comprises a plurality of incremental inductances. These inductances are adapted to be selectively connected in the tuned circuit 86 by means of a switch S–3″, which switch S–3″ is thus used to adjust the resonant frequency of the tuned circuit 86. The amplified RF signal which is provided across the tuned circuit 86 is coupled through a coupling capacitor 87 and across a resistive grid leak network 88 between the control grid 89 and the cathode 93 of a double triode 92 which includes a pair of anodes 94 and 95. The double triode 92 is enclosed within the same envelope as is a pentode 96 which provides the gain for an IF amplifier circuit 97.

As shown schematically in FIG. 4 and more fully described hereinafter, the triode 92 provides two space current paths, both of which are controlled by the signal on the control grid 89. In accordance with this aspect of the invention, the output signal from the anode 94 is fed back from across a capacitor 100 through a coil 101, a resonant circuit 102 and a blocking capacitor 103 between the control grid 89 and the cathode 93 of the double triode 92. The necessary energization voltage for the anode 94 is provided from a suitable B+ source connected to a terminal 105, through a load resistor 106, the tuned circuit 102, and the coil 101 to the anode 94. The B+ voltage for the anode 95 is coupled from the B+ terminal 105 through a load resistor 107 and a portion of an m-derived pi type coupling network 109. In the tuner circuit of FIG. 4, the mixing action results in the IF signal appearing between the anode 95 and cathode 93 and, therefore, across the capacitor 110. The IF signal is selectively coupled from the capacitor 110 through the filter network 109 and through a blocking condenser 112 to the control grid of the IF amplifier 96. The IF amplifier circuit 97 may be identical with the IF amplifier 66 of FIG. 3 and, therefore, a detailed description thereof at this time is unnecessary.

In the circuit of FIG. 4, the separate space current paths through the double triode 92 has the effect of two separate tubes and appreciably reduces the effect of the adjustment of the IF amplifier 97 on the mixer-oscillator 85. Accordingly, in the embodiment of the invention illustrated in FIG. 4, interaction between the mixer-oscillator 85 and the IF amplifier 97 is substantially eliminated since the IF amplifier is driven from a separate source and as indicated before in connection with the circuits of FIGS. 2 and 3, the use of separate tubes for the RF amplifier and the mixer-oscillator sections of the tuner eliminates any interaction between the RF amplifier and the mixer-oscillator circuit. Consequently, in the circuit of FIG. 4 only two tubes are necessary in a tuner which not only provides RF amplification and superheterodyning action but, moreover, provides amplification of the IF output signal of the superheterodyned portion of the tuner.

Figures 5, 6:
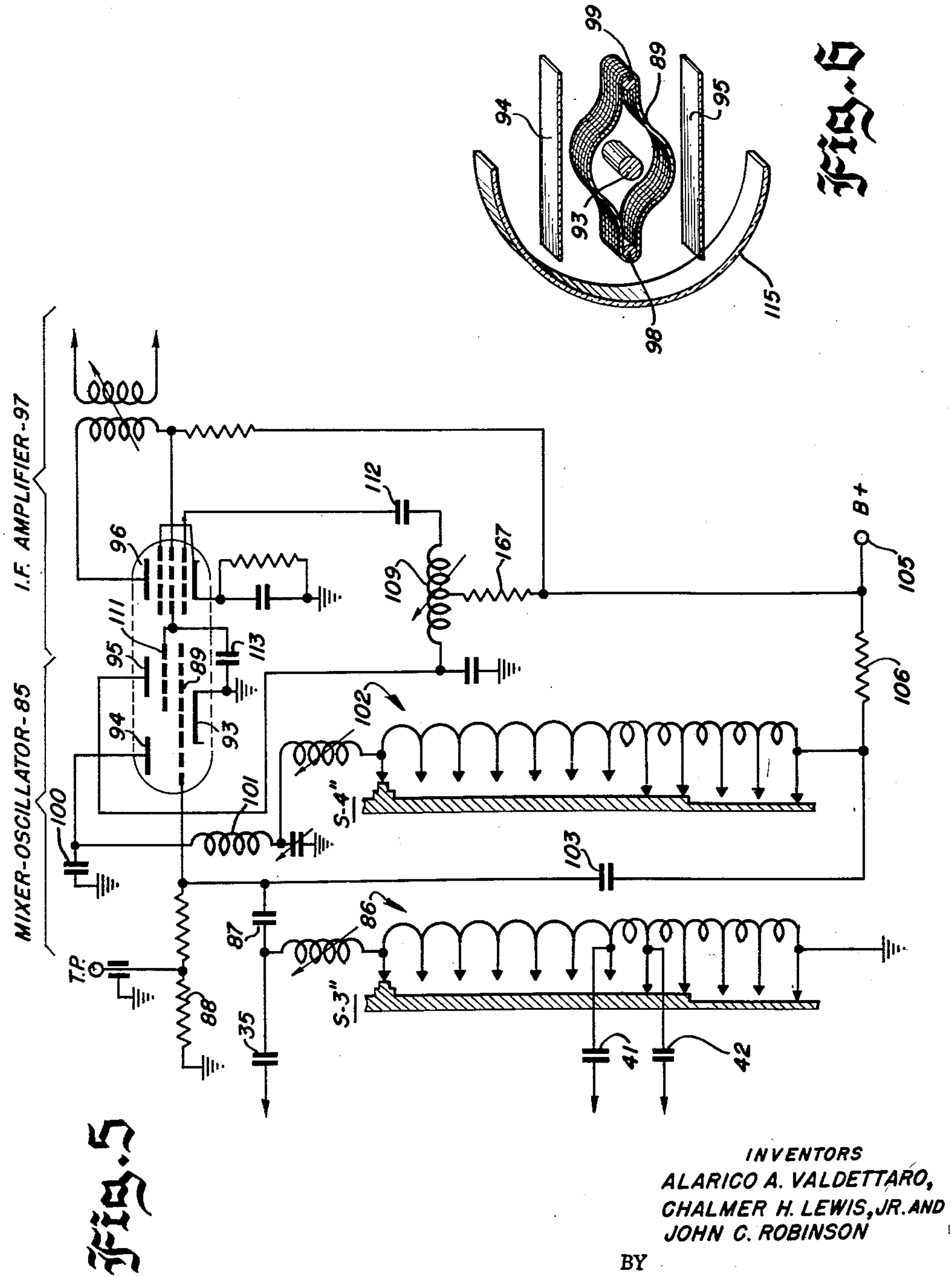
FIG. 5 is a schematic circuit diagram of a television tuner employing certain additional aspects of the present invention.
FIG. 6 is a schematic sectional view of a mixer-oscillator portion of a vacuum tube particularly suitable for use in the tuner circuit of FIG. 4.

The tube 92 shown in FIG. 4 comprises two triode sections and a pentode section, the latter section being connected as an IF amplifier. However, as shown in FIG. 5, in order to increase the gain in the portion of the tube including the space discharge path between the cathode 93 and the anode 95, a screen grid 111 may be mounted between the anode 95 and the control grid 89. The total number of tube pins from the tube is not increased by the addition of this grid since this additional screen grid is connected, internally of the tube, to the screen grid of the pentode section 96. RF signal interference between the tetrode and pentode sections is avoided by grounding the interconnected screen grids through a bypass capacitor 113 having a relatively high value. With the exception of these differences, the circuits of FIGS. 4 and 5 are identical.

Referring to FIG. 6, there is shown a fragmentary view of the double triode portion of a dual purpose tube employed in the tuner circuit of FIG. 4. As shown, this tube includes a common, centrally disposed cathode 93, a single mesh electrode or grid 89 surrounding the cathode 93, and a pair of planar anodes 94 and 95 disposed on opposite sides of the cathode 93 and parallel to a plane defined by a pair of mounting rods 98 and 99 which support the grid 89. A portion of the tube envelope is designated 115.

It will thus be clear to those skilled in the art that each of the three circuit embodiments hereinbefore described reduces the number of tubes in a television receiver by utilizing a mixer-oscillator circuit in which the mixer-oscillator tube is enclosed within the same envelope as an IF amplifier to which the output of the mixer circuit is supplied for amplification and coupling to the second IF stage of the associated television receiver. In order to provide the same functions in a conventional tuner circuit, the use of three tubes is required; consequently, the cost of such an arrangement would be appreciably more than that which must be expended to provide a tuner in accordance with the teachings of the present invention. It will thus be clear to those skilled in the art that the manufacturing cost of the tuner of the present invention is substantially the same as two-tube tuners which are now on the market but which do not include any IF amplification.

While the present invention has been described in connection with particular embodiments thereof, it will be understood that those skilled in the art may make many changes and modifications without departing from the true spirit and scope of this invention as defined in the appended claims.

What is claimed as new and is desired to be secured by Letters Patent of the United States is:

We claim:

1. In a television tuner, a single electron discharge device having a mixer oscillator section, an isolation section and an IF amplifier section, said mixer-oscillator section having a first cathode, a signal grid and a first anode, means for coupling a signal modulated RF signal to said signal grid, a positive feedback path including an oscillatory tank circuit connected between said first anode and said signal grid, said isolation section comprising said cathode, said signal grid and a second anode, whereby an IF signal is developed at said signal grid which is transmitted through said isolation section, said IF amplifier section comprising a second cathode, a control grid and a third anode, means for coupling said IF signal from said second anode to said control grid, and tuned circuit means in circuit with said third anode for deriving therefrom an amplified IF signal.

2. In a television tuner, a single electron discharge device having a mixer-oscillator section and an IF amplifier section, said mixer-oscillator section having a first cathode, a signal grid and a first anode, means for coupling a signal modulated RF signal to said signal grid, a positive feedback path including an oscillatory tank circuit connected between said first anode and said signal grid, whereby an IF signal is developed at said signal grid, said IF section including a second cathode, a control grid and a second anode, a tuned circuit connected to said control grid and tuned to said intermediate frequency, and means for coupling the IF signal appearing at said signal grid to said tuned circuit, said last named means including means for isolating said signal grid from said tuned cricuit so that adjustment of said tuned circuit has little effect on said mixer-oscillator section.

3. In a television tuner, a single electron discharge device having a mixer-oscillator section and an IF amplifier section, said mixer-oscillator section having a first cathode, a signal grid and a first anode, means for coupling a signal modulated RF signal to said signal grid, a positive feedback path including an oscillatory tank circuit connected between said first anode and said signal grid, whereby an IF signal is developed at said signal grid, said IF section including a second cathode, a control grid and a second anode, a tuned circuit connected to said control grid and tuned to said intermediate frequency, and means for coupling the IF signal appearing at said signal grid to said tuned circuit, said last named means including an isolating section comprising said first cathode, said signal grid and a third anode which transmits said IF signal to said IF amplifier section while preventing adjustment of said tuned circuit from affecting said mixer-oscillator section.

4. A television tuner as claimed in claim 3, wherein said isolating section and said IF amplifier section are each provided with a screen grid, said screen grids being connected together internally of said discharge device.

References Cited in the file of this patent

UNITED STATES PATENTS

| | | |
|---|---|---|
| 2,073,078 | Smith | Mar. 9, 1937 |
| 2,094,470 | Van Roberts | Sept. 28, 1937 |
| 2,244,261 | Rath | June 3, 1941 |
| 2,314,785 | Holland | Mar. 23, 1943 |
| 2,631,229 | Chesus | Mar. 10, 1953 |
| 2,662,171 | Cock | Dec. 8, 1953 |
| 2,718,590 | Stegmueller | Sept. 20, 1955 |

FOREIGN PATENTS

| | | |
|---|---|---|
| 634,829 | France | Dec. 9, 1927 |